(12) United States Patent
Cho

(10) Patent No.: US 6,336,055 B1
(45) Date of Patent: Jan. 1, 2002

(54) METHOD FOR CONTROLLING UNIT OPERATING STATES OF SEMICONDUCTOR FABRICATING EQUIPMENT ARRANGED IN A PROCESSING LINE

(75) Inventor: Pyong-il Cho, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/146,754

(22) Filed: Sep. 4, 1998

(30) Foreign Application Priority Data

Jan. 14, 1998 (KR) ................................................ 98-802

(51) Int. Cl.$^7$ .............................................. G06F 19/00
(52) U.S. Cl. ........................ 700/121; 700/109; 702/183
(58) Field of Search ................................ 700/121, 109, 700/110; 702/183, 184, 185; 716/4; 706/912

(56) References Cited

U.S. PATENT DOCUMENTS

| | | | |
|---|---|---|---|
| 5,469,361 A | * 11/1995 | Moyne | 700/95 |
| 5,591,299 A | * 1/1997 | Seaton et al. | 700/121 |
| 5,642,296 A | * 6/1997 | Saxena | 702/84 |
| 5,841,661 A | * 11/1998 | Buchanan et al. | 700/121 |
| 5,862,054 A | * 1/1999 | Li | 700/121 |
| 5,943,230 A | * 8/1999 | Rinnen et al. | 700/18 |
| 6,161,054 A | * 12/2000 | Rosenthal et al. | 700/121 |

* cited by examiner

Primary Examiner—William Grant
Assistant Examiner—Zoila Cabrera
(74) Attorney, Agent, or Firm—Volentine Francos, PLLC

(57) ABSTRACT

A method for controlling equipment in a semiconductor fabrication system includes automatically receiving operating data from equipment in a semiconductor fabrication system indicating operating conditions of units of the equipment. Reference data corresponding to the equipment are retrieved from a data base and indicate operating ranges for the respective units. It is then determined whether the operating conditions are within the operating ranges for the respective units. If the operating conditions are within the operating range for all the units, the method returns to automatically receiving operating state data. If the operating conditions are not within the operating range for a certain unit, in a variable ID a key value corresponding to the certain unit is changed indicating a change in the operating state. The operating state of the unit is then actually modified by inserting the variable ID into a equipment control message and downloading the equipment control message into the equipment. As a result, operation problems due to abnormally operating units in equipment are prevented without turning off the whole equipment, and productivity of the processing line is enhanced.

6 Claims, 3 Drawing Sheets

METHOD FOR CONTROLLING UNIT OPERATING STATES OF SEMICONDUCTOR FABRICATING EQUIPMENT ARRANGED IN A PROCESSING LINE

BACKGROUND OF THE INVENTION

1. Field of the Invention

The present invention relates to a method for controlling equipment in a semiconductor manufacturing system, and more particularly, to a method for automatically controlling the operating states of units of equipment in real time by a unit operating state monitoring module.

2. Description of the Related Art

Generally, the fabrication of semiconductor devices involves highly precise processes that require finely tuned precision equipment. Several pieces of precision equipment are typically employed in sequence and arranged on a semiconductor processing line. The operation of each piece of precision equipment on the line is closely monitored by operators to maintain and enhance the efficiency of the processing line.

As shown in FIG. 1, conventional fabrication equipment 3 are disposed on a conventional processing line. When a lot 10 of workpieces, such as wafers, are introduced into the equipment 3, the equipment 3 performs a fabrication process on the lot 10. The equipment 3 is connected on-line to a host computer 1 through an equipment server (not shown). An operator interface (O/I) 2, for example an operator interface personal computer (O/I PC), is also connected on-line to the host computer 1. Through the O/I 2, an operator informs the host computer 1 that a process using the equipment 3 is about to commence. The operator inputs into the host computer 1 basic manufacture data, e.g., the identification number (ID) of the lot 10 to be processed in the equipment 3 and the ID of the equipment 3 for performing the process with the lot 10.

Then, based on the input basic manufacture data, the host computer 1 searches its data base for the process condition data to be applied to the process on the lot 10. The host computer 1 immediately downloads these process condition data, including preset process settings, to the equipment 3. Process settings may include, for example, a desired process time duration or a desired process temperature.

Thereafter, the operator checks the process condition data and inputs a process commencing command or a process terminating command. The lot 10 is then automatically and rapidly routed into and out of the equipment 3. In this manner, the process equipment 3 performs on the workpieces of each lot 10 based on the process settings received.

The equipment 3 performs the process on the lot 10 by operating units or components of the equipment, e.g., loading and unloading ports (not shown) and chambers 4.

While the equipment 3 perform the process with the lot 10, the operator closely monitors the operation of the equipment 3 and their units through the O/I 2. If any problem occurs in a certain unit, e.g., in a certain chamber of the chambers 4, the operator immediately turns off the equipment 3 to stop the whole process. Thereby, operating problems due to processing a lot 10 with an abnormally operating unit are prevented.

However, such a conventional system for controlling semiconductor fabricating equipment suffers from several problems. First, it is difficult for the operator to recognize in real time that any abnormal operation is occurring in only a few units of the equipment, and the other units of the equipment are operating normally. As a result, the process line can not be immediately modified to adjust to the abnormally operating units, i.e., the abnormally operating units cannot be isolated immediately from the normal fabrication processing flow.

Secondly, if lots 10 are introduced into the abnormally operating units during the delay in the operator's recognition of which units are operating abnormally, production problems may occur, e.g., defective workpieces may be produced in the abnormally operating units.

Thirdly, when abnormally operating units are recognized, the whole equipment is turned off to repair the abnormally operating units—even if the processing line could continue with the normal units of the equipment. This results in degraded operational efficiency of the entire process line.

SUMMARY OF THE INVENTION

It is therefore an object of the present invention to prevent production problems due to abnormally operating units by recognizing the operating states of units of equipment in real time and isolating the abnormally operating units, using an unit operating state monitoring module included in a host computer.

It is another object of the present invention to enhance the operational efficiency of a processing line by turning off only the abnormally operating units individually, using the unit operating state monitoring module.

To achieve the above objects and other objects and advantages of the present invention, a method for controlling equipment in a semiconductor fabrication system includes automatically receiving operating data from equipment in a semiconductor fabrication system indicating operating conditions of units of the equipment. Reference data corresponding to the equipment are retrieved from a data base and indicate operating ranges for the respective units. It is then determined whether the operating conditions are within the operating ranges for the respective units. If the operating conditions are within the operating range for all the units, the method returns to automatically receiving operating state data. If the operating conditions are not within the operating range for a certain unit, in a variable ID a key value corresponding to the certain unit is changed indicating a change in the operating state. The operating state of the unit is then actually modified by inserting the variable ID into a equipment control message and downloading the equipment control message into the equipment. As a result, operation problems due to abnormally operating units in equipment are prevented without turning off the whole equipment, and productivity of the processing line is enhanced.

BRIEF DESCRIPTION OF THE DRAWINGS

The present invention is described in detail with reference to the accompanying drawings, in which.

DETAILED DESCRIPTION OF THE PREFERRED EMBODIMENTS

The present invention now will be described more fully with reference to the accompanying drawings. In this specification, it is understood that equipment can refer to a stand-alone apparatus or a group of such apparatuses. It is also understood that the state of equipment can be the value of a single parameter or an array of values corresponding to several parameters. It is also understood that any predetermined values can be provided in any number of conventional ways known to those of ordinary skill in the art, including, for example, an on-line storage device, a look-up-table, and manual input by an operator.

Figure 1:
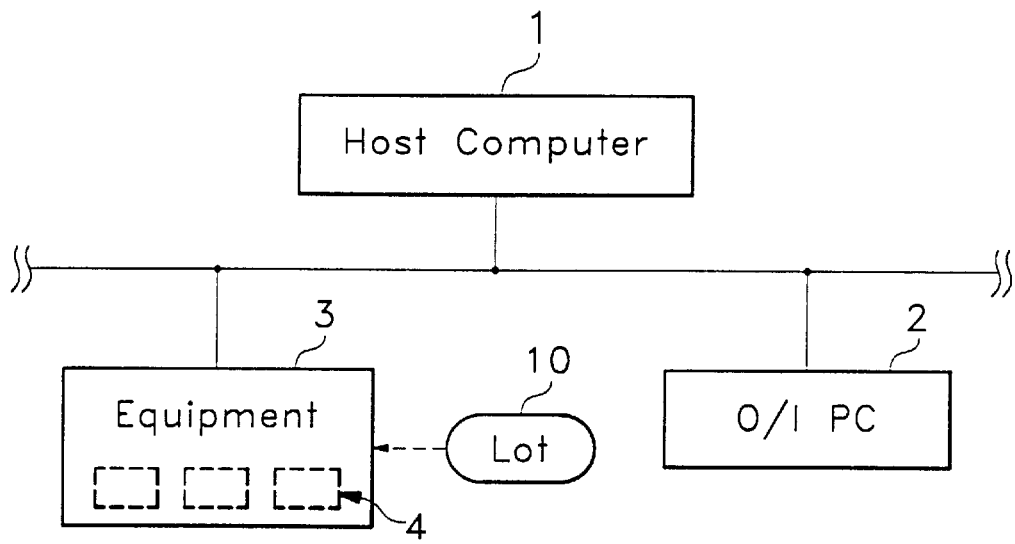
FIG. 1 is a schematic block diagram of a conventional controlling system for semiconductor manufacturing equipment in a processing line.
Figure 2:
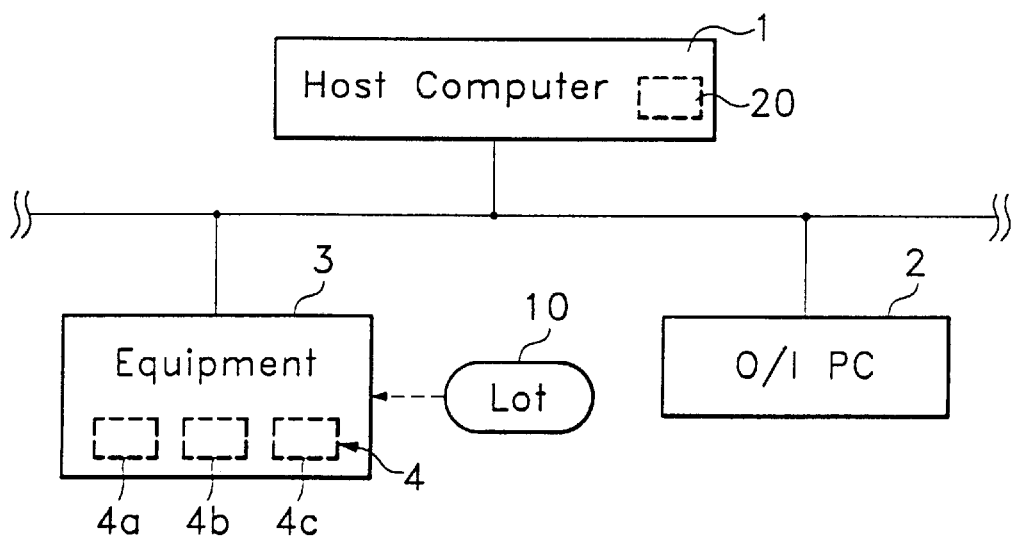
FIG. 2 is a schematic block diagram of a controlling system for semiconductor manufacturing equipment in a processing line using the present invention therein.

As shown in FIG. 2, a host computer 1 includes a unit operating state monitoring module 20 which receives operating data describing operating conditions of equipment 3 including any units 4 of that equipment 3. The operating data are uploaded from the equipment 3 through an equipment server (not shown). When the unit operating state monitoring module 20 is installed in the host computer 1, the equipment 3 is also provided with an appropriate reporting function so that the operating states of units of equipment can be reported by the equipment 3 to the unit operating state monitoring module 20 in real time.

The unit operating state monitoring module 20 continuously controls the operating states of the units of the equipment by monitoring the operating conditions of those units and comparing them with corresponding reference data stored in a data base on the host computer 1. In this way the unit operating state monitoring module checks automatically and in real time whether the units of equipment are operating normally or not. If some of the units of equipment are not operating normally, the abnormally operating units of equipment are immediately turned off and isolated from the fabrication processing flow. The fabrication processing flow continues through the normally operating units.

For example, if an error occurs in a first chamber 4a, the unit operating state monitoring module 20 turns off the first chamber 4a so that the first chamber 4a can be isolated from the flow of lots into the other normally operating chambers, i.e., a second chamber 4b and a third chamber 4c. Since only the first chamber is turned off and the other chambers 4b and 4c are still on, the process using equipment 3 can continue to be performed in the equipment 3. This results in enhanced productivity of the processing line.

Figure 3:
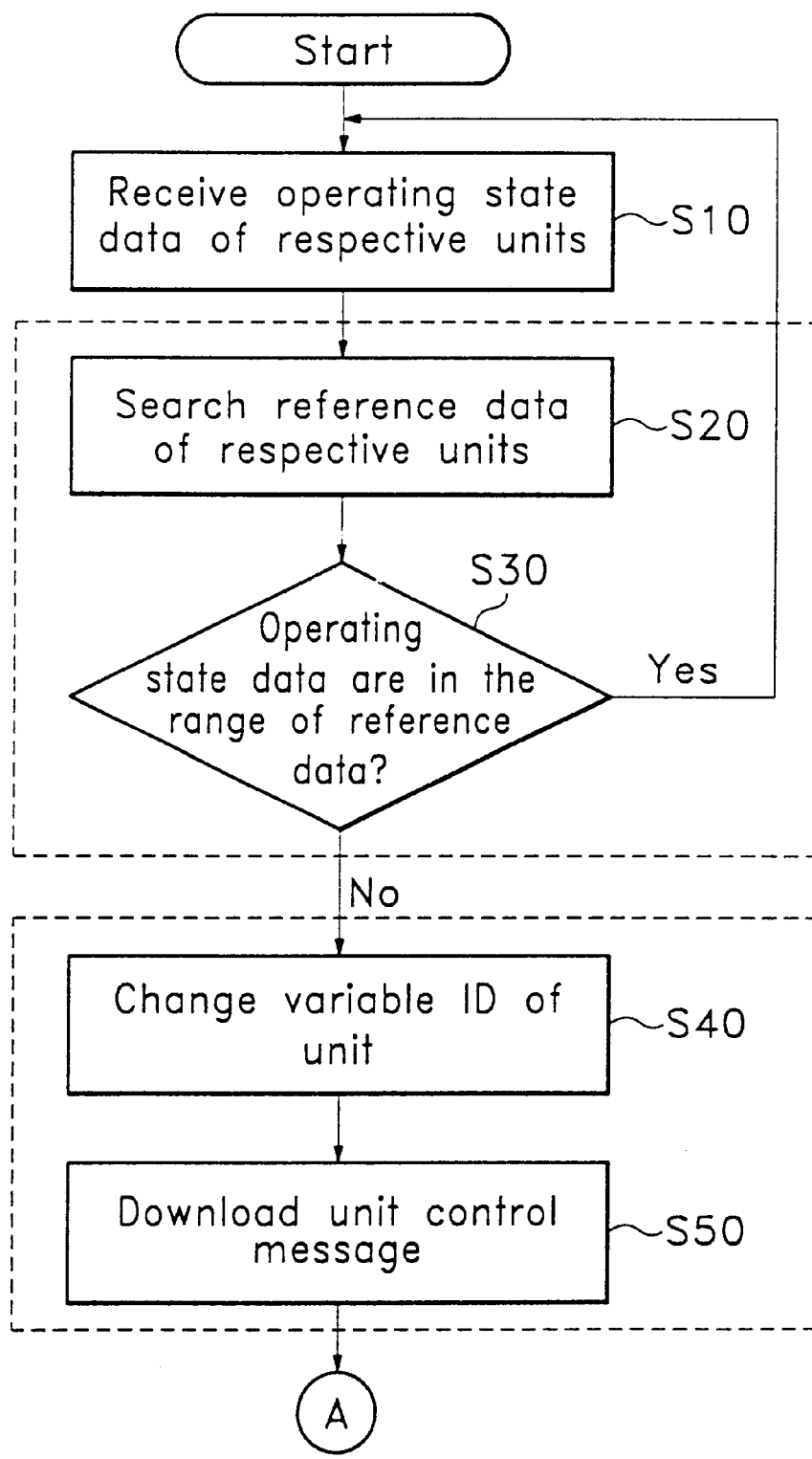
FIG. 3 is a flowchart of a method for automatically controlling unit operating states of the equipment according to the present invention.

As shown in the method of FIG. 3, first, the unit operating state monitoring module 20 receives operating data from the equipment (S10). The operating data include values of parameters corresponding to the operating conditions of the respective units of the equipment 3. The operating data are continuously uploaded from the equipment 3 in real time so that the operating conditions of the respective units of equipment 3 can be immediately recognized by the unit operating state monitoring module 20. Reference data for the equipment 3, with values for parameters corresponding to the respective units of the equipment 3, are stored in a data base of the host computer 1. The unit operating state monitoring module 20 searches for and extracts, i.e. retrieves, reference data for the equipment 3 and associated units from the data base (S20).

The unit operating state monitoring module 20 compares the received operating data with the searched reference data and determines whether there is any unit of the equipment with a parameter value in the operating data which is not in the range of the reference data corresponding to that unit of equipment (S30). If the operating data are in the ranges of the reference data for all corresponding units of equipment, i.e., there is no parameter of the operating data which is not within the range of the reference data corresponding to the same unit of equipment, the unit operating state monitoring module 20 returns to the first step S10, and continuously receives operating state data.

Otherwise, if it is determined that one or more of the parameters of the operating data are not within the range of the reference data corresponding to the respective units of equipment, i.e., that one or more of the parameters have abnormal values, the state of the corresponding abnormally operating units of equipment need to be changed. This is done by changing the key value of a variable ID corresponding to the respective units of equipment (S40). In the preferred embodiment, the unit operating state monitoring module 20 transmits the results of step S30 to the host computer 1. The host computer 1 then changes the key value of the variable ID corresponding to the abnormally operating units of equipment into the off state (S40). Subsequently the unit operating state monitoring module 20 inserts the variable ID with the changed key value into a equipment control message and downloads that message to the equipment (S50). As a result, the abnormally operating units of equipment are isolated from the other normally operating units of equipment. In the preferred embodiment, the isolation is effected by turning off the abnormally operating units.

For example, if the parameter is the amount of time the first chamber 4a is operated, and the reference data indicate a range of 0 hours to 10,000 hours for this parameter while the received operating data has a value of 10,001 hours for the corresponding parameter, then the operating data are not within the range of the reference data for the first chamber 4a, i.e., the operating condition is not within the operating range for this unit. The unit operating state monitoring module 20 determines this, and informs the host computer of a problem with the first chamber 4a. Accordingly, the host computer 1 changes the key value of the variable ID corresponding to the first chamber 4a into the OFF state to immediately isolate the first chamber 4a from the other normally operating chambers 4b and 4c. After the step S40, the unit operating state monitoring module 20 receives the variable ID with the changed key value from the host computer 1, loads the variable ID on the equipment control message, and downloads the equipment control message into the equipment 3 (S50). Accordingly, the equipment can turn off the abnormally operating unit of equipment, i.e., the first chamber 4a, immediately.

In the preferred embodiment, the variable ID changed by the host computer 1 is an equipment constant ID (ECID) which controls the operating states of all the chambers 4, the equipment control message is a stream function message that allows smooth communication, and the stream function format of the unit control message is S1F12 which is suitable for standard communications.

For example, if it is recognized that the first chamber 4a is operating abnormally, the unit operating state monitoring module 20 turns off the first chamber 4a to isolate it from the other normally operating chambers 4b and 4c. The unit operating state monitoring module 20 receives an ECID in which the state of the key value corresponding to the abnormal chamber 4a has been changed into the OFF state through the host computer 1. The unit operating state monitoring module 20 loads this ECID into a stream function message using an S1F12 format. Then, the unit operating state monitoring module 20 downloads the S1F12 message into the equipment 3. As a result, only the first chamber 4a is turned off according to this ECID and thus the chamber 4a is immediately and automatically isolated from the other normally operating chambers 4b and 4c.

In contrast, using the conventional controlling system it is difficult for the operator to recognize abnormally operating units of equipment in real time. Therefore normal process flow cannot be diverted from the abnormally operating unit immediately. As a consequence, production problems may occur.

In the controlling system according to the present invention, the host computer 1 is capable of recognizing the abnormally operating units of the equipment 3 through the unit operating state monitoring module 20 in real time, without intervention of the operator. With the present invention, the host computer 1 is also capable of isolating the abnormally operating units of equipment from the normally operating units of equipment immediately, by using the equipment control message. Thereby, production problems caused by the abnormally operating units of equipment can be prevented.

Figure 4:
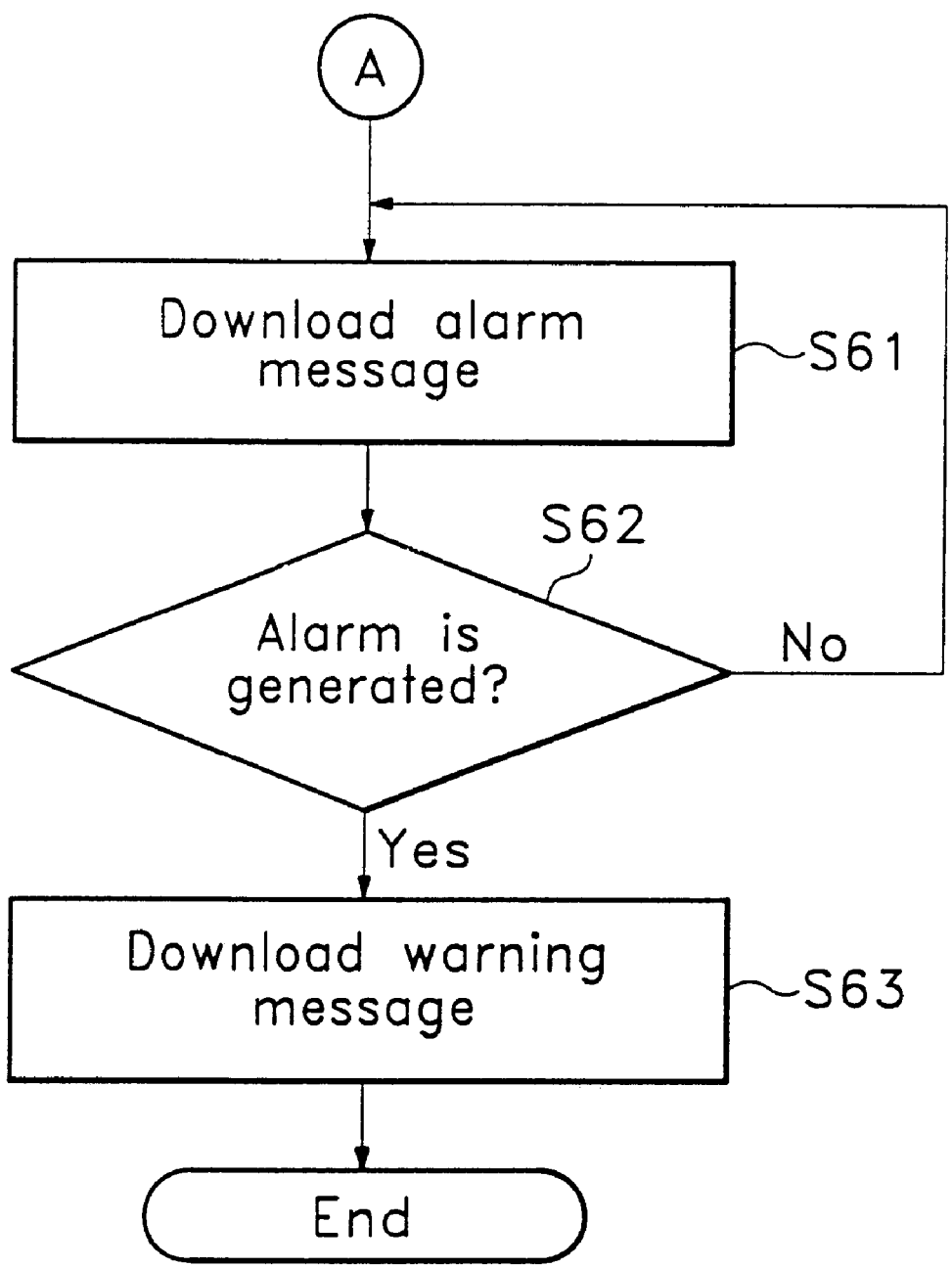
FIG. 4 is a flowchart of a preferred embodiment of a method for automatically controlling unit operating states of the equipment according to the present invention.

As shown in FIG. 4, after step S50, the unit operating state monitoring module 20 may download an alarm message into the equipment 3 to instruct the equipment 3, by remote control commands, to generate a warning sound having a predetermined loudness (S61). When the warning sound is generated, the operator is alerted in real time that an operating problem has occurred in certain equipment 3. The message also informs the operator which units of the equipment have the problem. In response the operator can take appropriate action immediately to solve the operating problem. For example, the operator can perform preventative maintenance on a chamber that has been turned off because it was used for more than its rated duration.

In the preferred embodiment, the alarm message is a stream function message that allows smooth communication, and the stream function format of the alarm message is S2F41 which is suitable for standard communications.

After downloading the alarm message into the equipment 3, the unit operating state monitoring module 20 continuously monitors the operation of the equipment 3 and determines whether an alarm is generated from the equipment 3 in response to the alarm message (S62). If the equipment 3 does not generate the alarm, the unit operating state monitoring module 20 determines that a problem occurred in the downloading communication and returns the controlling process flow to the step S61 to repeat downloading the alarm message into the equipment 3.

Otherwise, if it is determined that the alarm is generated from the equipment 3, the unit operating state monitoring module 20 downloads a warning message with text into the equipment 3 for display at a consol of the equipment 3 (S63). According to the text of the warning message, the operator identifies the abnormally operating units of equipment and takes appropriate action immediately to solve the operating problems.

In the preferred embodiment, the warning message is a stream function message that allows smooth communication, and the stream function format of the warning message is either an S10F3 format or an S10F5 format, both of which are suitable for standard communications. Of the two, the S10F5 format is capable of transmitting more text.

The warning message may be downloaded into an O/I PC 2 as well as into the console of the equipment 3. Therefore, even though the operator is at a great distance from the equipment 3, the operator can identify immediately the abnormally operating units of equipment through the O/I PC 2 near the operator, and take appropriate action.

Efficient equipment control is provided by repeating the above steps through the host computer.

As aforementioned, in the present invention, the operating states of the units of equipment of the equipment can be controlled in real time through the unit operating state monitoring module 20. Thereby, abnormally operating units of equipment can be immediately isolated from other normally operating units of equipment, and fabrication. processing flow can continue without shutting down the equipment entirely.

This invention has been described above with reference to the aforementioned embodiments. It is evident, however, that many alternatives, modifications and variations will be apparent to those having skill in the art in light of the foregoing description. For example, the present invention can be applied to various types of semiconductor manufacturing equipment which are arranged in a processing line and benefit from enhanced efficiency when abnormally operating units of equipment are separated from normally operating units and turned off. Accordingly, the present invention embraces all such alternatives, modifications and variations as fall within the spirit and scope of the appended claims and their equivalents.

What is claimed is:

1. A method for controlling equipment in a semiconductor fabrication system, the method comprising:

continuously receiving real time operating data from equipment in a semiconductor fabrication system, the operating data indicating operating conditions of units of the equipment;

retrieving reference data corresponding to the equipment from a data base, the reference data indicating operating ranges for the respective units;

determining whether the operating conditions are within the operating range for all the units;

if the operating conditions are within the operating range for all the units, returning to said automatically receiving operating state data;

if the operating conditions are not within the operating range for a certain unit, changing, in a variable ID, a key value corresponding to the certain unit, indicating a change of an operating state for the certain unit; and modifying the operating state of the certain unit, including inserting the variable ID into an equipment control message and downloading the equipment control message into the equipment, after said changing the key value.

2. The method of claim 1, wherein, during said modifying, the equipment control message is a stream function message.

3. The method of claim 1, wherein, during said changing a key value, the variable ID is an equipment constant ID.

4. The method of claim 1, after said modifying, further comprising:

downloading a predetermined alarm message into the equipment;

determining whether an alarm is generated from the equipment or not;

if the alarm is not generated, returning to said downloading a predetermined alarm message; and if the alarm is generated, downloading a predetermined warning message into the equipment.

5. The method of claim 4, wherein:

during said downloading the alarm message, the alarm message is a stream function message; and during said downloading the warning message, the warning message is a stream function message.

6. The method of claim 1, wherein:

during said changing the key value, the change of the operating state indicates a change to a non-operational state; and during said modifying the operating state of the certain unit, the certain unit is turned off.

* * * * *